United States Patent [19]

Carriere et al.

[11] 4,323,885

[45] Apr. 6, 1982

[54] NOISE AND CROSSTALK REDUCTION IN MID-RISER BIASED ENCODERS

[75] Inventors: Joseph F. Carriere, Andover; Wilmer B. Gaunt, Jr., Boxford, both of Mass.; Joseph E. Landry, Atkinson; Dewayne A. Spires, Plaistow, both of N.H.

[73] Assignee: Bell Telephone Laboratories, Incorporated, Murray Hill, N.J.

[21] Appl. No.: 192,432

[22] Filed: Sep. 29, 1980

[51] Int. Cl.$^3$ ............................................. H03K 13/02
[52] U.S. Cl. ...................... 340/347 CC; 340/347 AD; 375/26
[58] Field of Search .... 340/347 M, 347 AD, 347 CC; 324/99 D; 375/26

[56] References Cited

U.S. PATENT DOCUMENTS

| 3,646,586 | 2/1972 | Kurz | 340/347 AD |
| 3,735,392 | 5/1973 | Kaneko | 340/347 AD |
| 4,151,516 | 4/1979 | O'Neill | 340/347 CC |
| 4,193,066 | 3/1980 | Morrison | 340/347 CC |

OTHER PUBLICATIONS

By Bell Telephone Lab. Staff, "Transmission Systems for Communications", Dec. 1971, pp. 583-585.

Primary Examiner—Charles D. Miller
Attorney, Agent, or Firm—David R. Padnes

[57] ABSTRACT

A reduction in idle channel noise and crosstalk in a mid-riser-biased successive approximation encoder is achieved through the use of two polarity decisions. Encoder (401) assigns a sampled analog input signal to the closest one of a multitude of discrete signal levels or code steps. A comparator (109) provides this assignment by successive comparisons of the sampled signal with a series of reference signals (110). Each comparison produces a binary digit. The first comparison, or polarity decision, is not transmitted and instead coupled to feedback circuitry (401) to reduce any dc component in the analog input signal to substantially zero. A second polarity decision is then made using a non-zero offset reference signal (402) corresponding to an intermediate position on a code step, typically the midpoint. The non-zero offset reference signal is applied along with subsequent reference signals to the comparator to determine the closest code step. The binary digit from the second polarity decision, along with the binary digits representing the code step, are coupled to the encoder output. Accordingly, the encoder is now biased at the intermediate position to substantially reduce the likelihood of idle channel noise and crosstalk enhancement.

14 Claims, 7 Drawing Figures

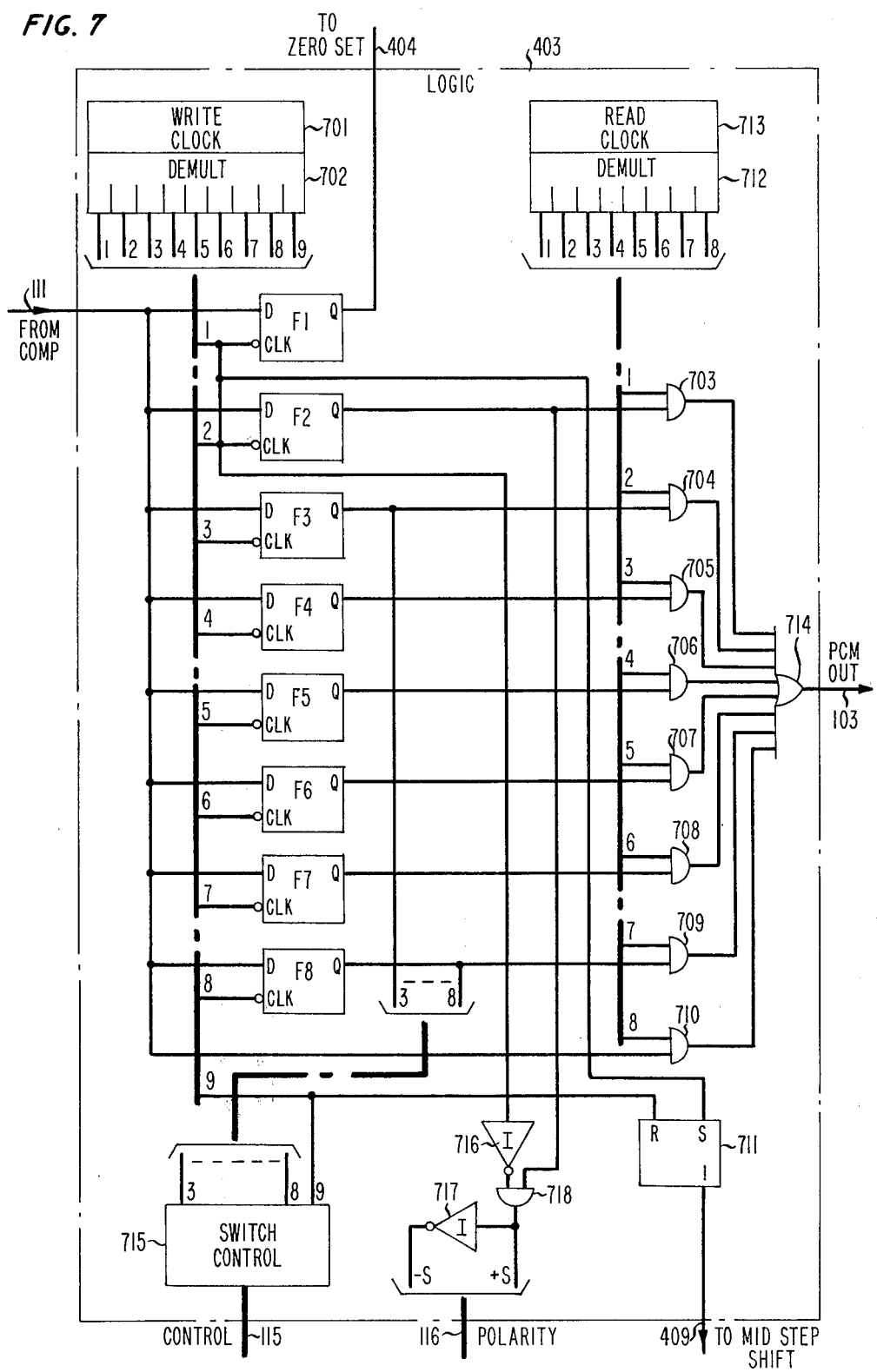

NOISE AND CROSSTALK REDUCTION IN MID-RISER BIASED ENCODERS

TECHNICAL FIELD

The present invention relates to PCM transmission systems and more particularly to a technique for reducing idle channel noise and crosstalk in mid-riser-biased, successive approximation encoders.

BACKGROUND OF THE INVENTION

Pulse Code Modulation (PCM) encoders translate an analog signal into a multi-bit PCM word. The coding process entails quantizing or assigning a sample of the analog signal to the nearest one of a number of discrete signal levels or steps. These steps, connected by risers, extend from an origin over a predetermined range of the analog signal. The origin is located on either a step or a riser depending on the type of coding. In mid-step-biased coding, such as μ-law coding, the origin is located on the mid-point of a step. Mid-riser-biased coding, such as the A-law coding used in European transmission systems, locates the origin on a riser. This distinction is of significance to the problem of idle channel noise and crosstalk as will be hereinafter discussed.

Successive approximation or feedback encoders are commonly used for both mid-step and mid-riser biased coding. In such encoders, each binary digit of the PCM word is sequentially determined from a comparison of the sampled analog signal vis-a-vis a reference signal. Typically, the first comparison determines the polarity of the sampled analog signal and is made with the reference signal at zero. Through a series of subsequent comparisons, a full PCM word is generated which corresponds to a particular code step. For a further discussion of successive approximation encoders, see Transmission Systems For Communications, published by WECo Inc., Revised Fourth Edition, 1971, pages 583–585.

Idle channel noise and crosstalk are a problem in systems where an analog signal is quantized. The problem is most acute when the encoder is biased, by an accumulation of dc voltage, at or near a code step boundary. Under this condition, a small signal perturbation, such as idle channel noise and crosstalk, is encoded as two code words. This results in enhancement of the original signal perturbation on decoding. In systems which transmit voice signals, this enhancement produces an undesirable audible sound. In mid-step-biased encoders, compensation for the dc voltage is introduced to bias the encoder at the origin. As this position is mid-way between code step boundaries, the likelihood of idle channel noise and crosstalk enhancement is minimized. Utilizing this technique for mid-riser biased encoders, however, biases the coder at a code step boundary and maximizes the likelihood of idle channel noise and crosstalk enhancement. Consequently, the problem of idle channel noise and crosstalk in mid-riser biased encoders is a continuing problem.

SUMMARY OF THE INVENTION

The present invention addresses itself to the problem of idle channel noise and cross-talk enhancement in mid-riser-biased, successive approximation encoders. The likelihood of such enhancement is minimized in accordance with the invention by biasing the encoder midway between code step boundaries. This biasing is achieved through the use of two polarity decisions, only one of which is transmitted.

As in all successive approximation encoders, an analog signal is converted to a multi-bit digital word. This conversion is performed by successive comparisons of a sample of the analog signal with a series of reference signals. Each comparison produces a binary digit which appears on the encoder output. As in existing PCM mid-riser-biased encoders, the first comparison is thee polarity decision. In the present invention, however, the results of the first comparison is not transmitted but is coupled to feedback circuitry. The feedback circuitry generates a compensating offset to reduce the average dc voltage in the analog signal to substantially zero, thereby biasing the encoder at the origin. Immediately following the first polarity decision, a second polarity decision is made using a second reference signal corresponding to a predetermined intermediate position on a code step. The intermediate position is chosen, based on the noise and cross-talk characteristics, to minimize the likelihood that noise and cross-talk perturbations will cross a code step or quantizing boundary. This second polarity decision made with the bias shifted to an intermediate position is transmitted. Typically, the intermediate position is the midpoint on a code step. In such a case, it is preferable that the second reference signal correspond to the midpoint of the first code step, i.e., either step immediately adjacent to the origin. A sequence of comparisons after the second polarity decision generates a series of binary digits which represent the closest code step to the sampled analog signal. This series is also transmitted following the second polarity decision.

A successive approximation encoder comprises a comparator, reference signal generator and logic apparatus. The logic apparatus controls the series of reference signals that are generated and applied to the comparator and clocks the comparator outputs to other circuitry. Pursuant to the present invention, feedback circuitry is added to generate a compensating offset in the input analog signal path from the first polarity decision. Apparatus for generating a non-zero offset reference signal, corresponding to the intermediate position on a code step, is added to the reference signal generator. This offset reference signal is applied to the comparator after the first polarity decision until a sample is completely encoded. The logic apparatus is modified to couple the binary digit generated by the first polarity decision to the feedback circuit and substitute, in lieu thereof, the second polarity decision on the encoder output.

A feature of the present invention is its adaptability to existing per channel or multi-channel successive approximation, mid-riser-biased encoders.

BRIEF DESCRIPTION OF THE DRAWING

FIG. 7 is a schematic block diagram of logic unit 403 shown in FIG. 4.

DETAILED DESCRIPTION

Figure 1:
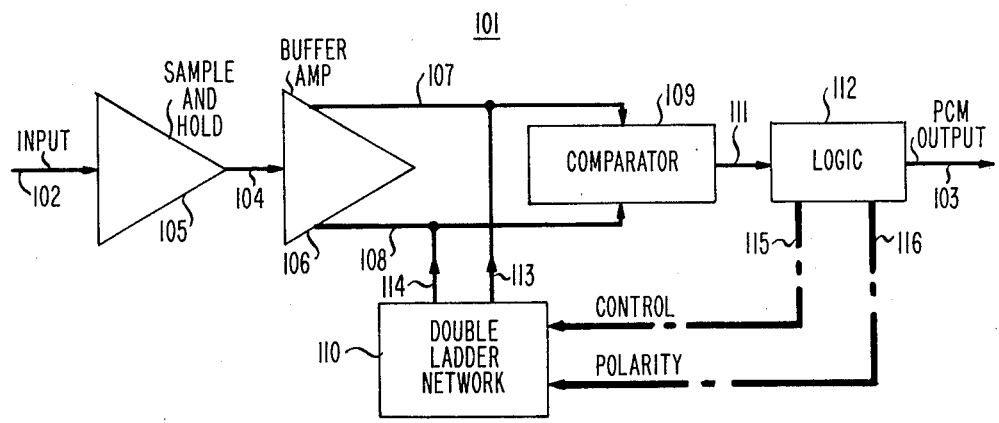
FIG. 1 is a block diagram of an existing successive approximation, mid-riser-biased encoder to which the present invention pertains.

Encoder 101, of FIG. 1, receives an analog signal on input lead 102 from one or more input channels (not shown). When only one channel is connected to input lead 102, encoder 101 is designated as a per channel encoder. In the alternative, encoder 101 can be shared by more than one channel and receives a multiplexed stream of pulse amplitude modulated (PAM) analog signals on lead 102. For purposes of illustration, it will be assumed that encoder 101 is a per channel encoder. The analog signal on lead 102 is sampled at a predetermined rate and encoded into a multi-bit PCM word which appears on output lead 103. Encoding entails assigning each analog sample to the nearest one of a number of discrete signal level or steps. This assignment is achieved by comparing each analog sample to a series of reference signals.

Initially, the analog signal on lead 102 is sampled by sample and hold circuit 105 and a voltage representative of the sample is maintained on output 104 during encoding. Of course, if the encoding speed is fast relative to the analog input frequency, the sample and hold circuit 105 may not be required. Output 104 is buffered by the buffer amplifier 106. Buffer amplifier 106 also converts the single-rail voltage on 104 to a double-rail or balanced signal on leads 107 and 108 which are inputs to comparator 109. Use of buffer amplifier 106 may also be deleted if the use of a balanced signal to comparator 109 is not required. The balanced representation of the analog sample is sequentially compared by comparator 109 against a series of differential reference voltages generated by double ladder network 110. These reference voltages are coupled to leads 107 and 108 via leads 113 and 114, respectively.

Comparator 109 produces a binary output from each comparison which is connected by lead 111 to logic unit 112. Since the response time of comparator 109 varies with the difference between input and reference signals, logic unit 112 stores the binary outputs of comparator 109 and clocks them onto output lead 103. Logic unit 112 also regulates, via control cable 115 and polarity cable 116, the differential reference voltages generated and coupled to leads 107 and 108. The first reference voltage applied to comparator 109 is 0 volts and the comparison made is designated the polarity decision. Subsequent reference voltages are generally dependent on the preceding binary output of comparator 109. For example, if the sampled analog signal voltage is higher than the reference voltage, comparator 109 produces a logical "1" which causes logic unit 112 to drive double ladder network 110 to produce a higher reference voltage for the next comparison. Alternatively, if the sampled analog signal voltage is lower than the reference voltage, a logical signal "0" is produced by comparator 109 to cause logic unit 112 to drive double ladder network 110 to produce a lower reference voltage for the next comparison. Typically, a total of eight comparisons are performed yielding an eight-bit PCM word on output 103.

Figure 2:
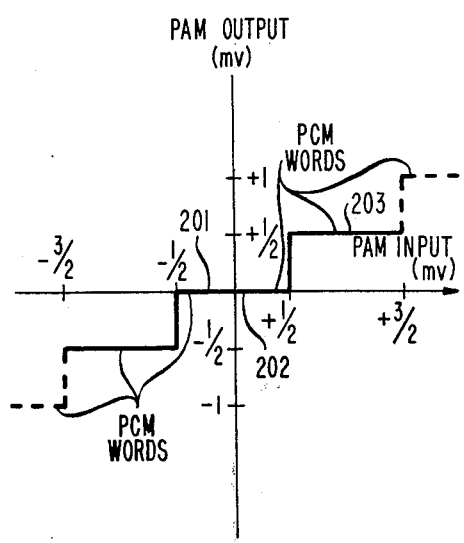
FIG. 2 is an illustrative representation of a mid-step-biased PCM coding characteristics about the origin.
Figure 3:
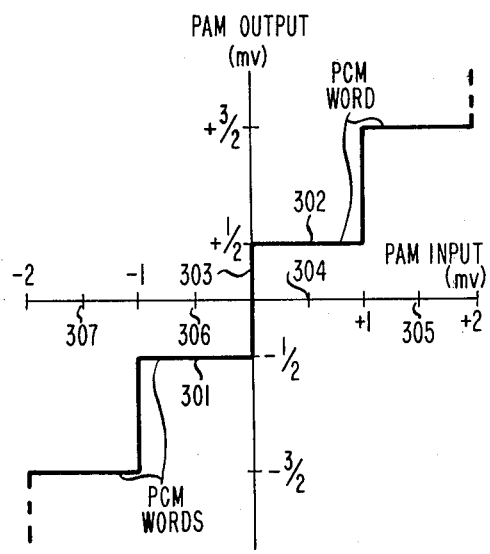
FIG. 3 is an illustrative representation of a mid-riser-biased PCM coding characteristic about the origin.

Refer now to FIGS. 2 and 3 which respectively show typical mid-step-biased and mid-riser-biased coding characteristics. One key difference between these characteristics resides in the treatment of low-level signals about the origin. In mid-step coding, such as the well-known $\mu$-law coding used in the U.S., the origin is centered between two steps. These steps, designated as 201 and 202, are represented by PCM words which are identical except for the first or polarity bit. In contrast, mid-riser-biased coding, such as the A-law coding widely used in European countries, the origin is located on a riser between two distinct steps. As shown in FIG. 3, the origin passes through the riser on step boundary 303 centered between steps 301 and 302. This distinction is of particular import in the treatment of idle channel noise and crosstalk.

When a mid-step biased encoder is biased by an accumulation of dc voltage at a code step boundary, e.g., plus ½ millivolts in FIG. 2, the slightest noise or crosstalk disturbance will be coded as two distinct PCM words. These words correspond to steps 202 and 203. On decoding, two PAM output signals will be produced thereby enhancing the small disturbances. The likelihood of this enhancement is minimized by biasing the encoder at the midpoint of a code step. Generally, the midpoint chosen is the origin itself which is centered between steps 201 and 202. This biasing technique is often referred to as "zero-setting". With "zero-setting", there is no noise or crosstalk enhancement unless the amplitude of the disturbance exceeds plus or minus one code step. While this technique works satisfactorily for mid-step-biased or $\mu$-law encoders, it is not applicable to mid-riser-biased or A-law encoders. In this regard, refer to FIG. 3. It should be noted that "zero-setting" an A-law encoder biases the encoder at the origin which is at code step boundary 303. Consequently, zero setting will maximize any noise or crosstalk enhancement. Furthermore, such enhancement is greater in A-law encoders as step sizes 301 and 302 are twice as large as their $\mu$-law steps 202 and 203.

To overcome the prior art problem of idle channel noise and cross-talk enhancement, encoder 101 is modified to allow the use of two polarity decisions. The first polarity decision, i.e., the first comparator decision, is made with a zero reference signal. Unlike existing encoders, however, this decision is not transmitted on output 103. Instead, it is used to bias encoder 101 at a riser. Preferably, riser 303 is used. Following the first polarity decision, a second polarity decision is made using a reference signal corresponding to a predetermined intermediate position on a code step. The intermediate position is chosen to minimize the likelihood that noise and cross-talk perturbations, based on their statistical nature, will cross a code step or quantizing boundary. Typically, the intermediate position corresponds to the midpoint of a code step, e.g., 304, 305, 306 or 307. This second polarity decision is transmitted on output 103. It is also preferable that in the typical case, the reference signal for the second polarity decision corresponds to the midpoint of the first positive or first negative code step adjacent to the origin (i.e., 301 or 302, respectively). The reference signal for the second polarity decision is applied along with subsequent reference signals until the analog sample is completely encoded. This use of two polarity decisions biases encoder 101 at the predetermined intermediate position to substantially reduce idle channel noise and cross-talk enhancement. After the second reference signal, the balance of the encoding process, as in the prior art, generates a series of binary digits which represents the closest code step to the analog sample.

Figure 4:
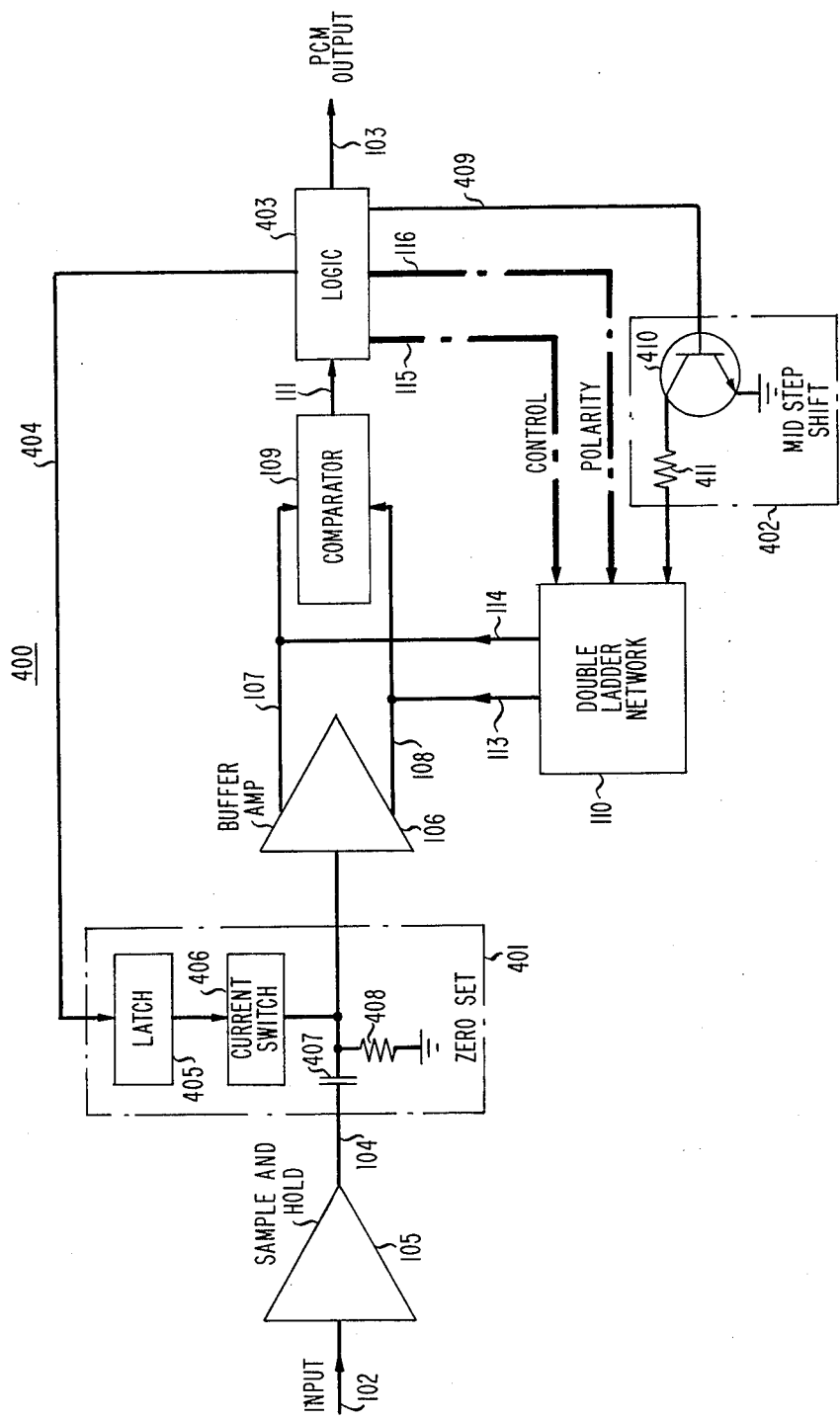
FIG. 4 is a block diagram of the present invention.

Refer now to FIG. 4 which shows encoder 400. Encoder 400 is similar to encoder 101 of FIG. 1 except for several modifications necessary to incorporate the above-described first and second polarity decisions. These modifications comprise the addition of zero set circuit 401, half step shifter biaser 402 along with a modified logic unit 403. Except for several modifications, described infra, logic unit 403 is identical to logic unit 112 of FIG. 1.

To initially bias encoder 400 at the origin, negative feedback is employed. The first polarity decision from each analog sample is coupled through logic unit 403 to lead 404. Lead 404 connects the logical "0" or "1" digit to zero set circuit 401. Circuit 401 comprises latch 405, current switch 406, capacitor 407 and resistor 408. Capacitor 407 and resistor 408 comprise an RC circuit. Capacitor 407 is disposed in the analog signal path between sample and hold circuit 105 and buffer amplifier 106. Resistor 408 forms a shunt between one side of capacitor 407 and ground. Latch 405 stores each first polarity decision until the encoding of an analog sample is completed. This decision is made once during the encoding of each analog sample. The binary digit stored in latch 405 is connected to current switch 406. Current switch 406 causes a predetermined amount of current to flow for the duration of each binary digit. If the binary digit in latch 405 is "0", current switch 406 will conduct current into capacitor 407 to increase the charge therein. Alternatively, if a "1" is stored in latch 405, current switch 406 will cause current to flow from capacitor 407 to reduce the charge therein. Resistor 408 and capacitor 407 are selected to have a long time constant so that zero set circuit 401 is not affected by sudden input signal changes. However, zero set circuit 401 will integrate the signals on lead 404 and produce a compensating offset which biases encoder 400 at riser 303. It should, of course, be understood that the compensating offset can be introduced at other points within encoder 400. For example, zero set circuit 401 could be connected on input lead 102. Furthermore, this zero set scheme is also adaptable to multi-channel encoders which receive signals on input lead 102 from a plurality of input channels. Alteration of the zero set scheme shown would merely require supplying the signals on lead 404 to each input channel. Then, using conventional timing circuitry, the signals on lead 404 can be demultiplexed and connected to zero set circuitry 401 in each input channel to generate a compensating offset.

After the first polarity decision is made, logic unit 403 activates mid-step shift biaser 402 via lead 409. Mid-step shift biaser 402 comprises transistor 410 and resistor 411. Upon activation, transistor 410 conducts a preselected amount of current from double ladder network 110 through resistor 411 to ground. Resistor 411 controls the amount of current drawn from double ladder network 110 to produce a voltage across leads 113 and 114 corresponding to the midpoint of a code step. While other code step midpoints can be chosen, preferably either midpoint 304 or 306 is used. The "midpoint" voltage generated across leads 113 and 114 is supplied to comparator 109 which compares the "midpoint" voltage against the analog sample. Comparator 109 generates either a logical "1" or "0" depending on whether the analog sample is respectively greater or less than the "midpoint" voltage. This comparator output is designated as a second polarity decision and appears as the first binary digit of the PCM word on output lead 103. The balance of the PCM word on output lead 103 is generated by a series of comparisons using reference signals generated by double ladder network 110. Each of these comparisons, after the polarity decision, produces binary digits which sequentially appear on lead 103. Half step shifter 402 remains activated after the first polarity decision until the analog sample is completely encoded.

The above description of mid-step shift biaser 402 applies to the most typical case where noise and crosstalk perturbations have equal positive and negative amplitudes. Consequently, it is desirable to bias encoder 400 at the midpoint of a code step. It should be noted, however, that the bias point can be shifted to any intermediate position on a code step by merely adjusting the value of resistor 411 until the current conducted from double ladder network 110 generates the desired offset voltage across leads 113 and 114.

Figure 5:
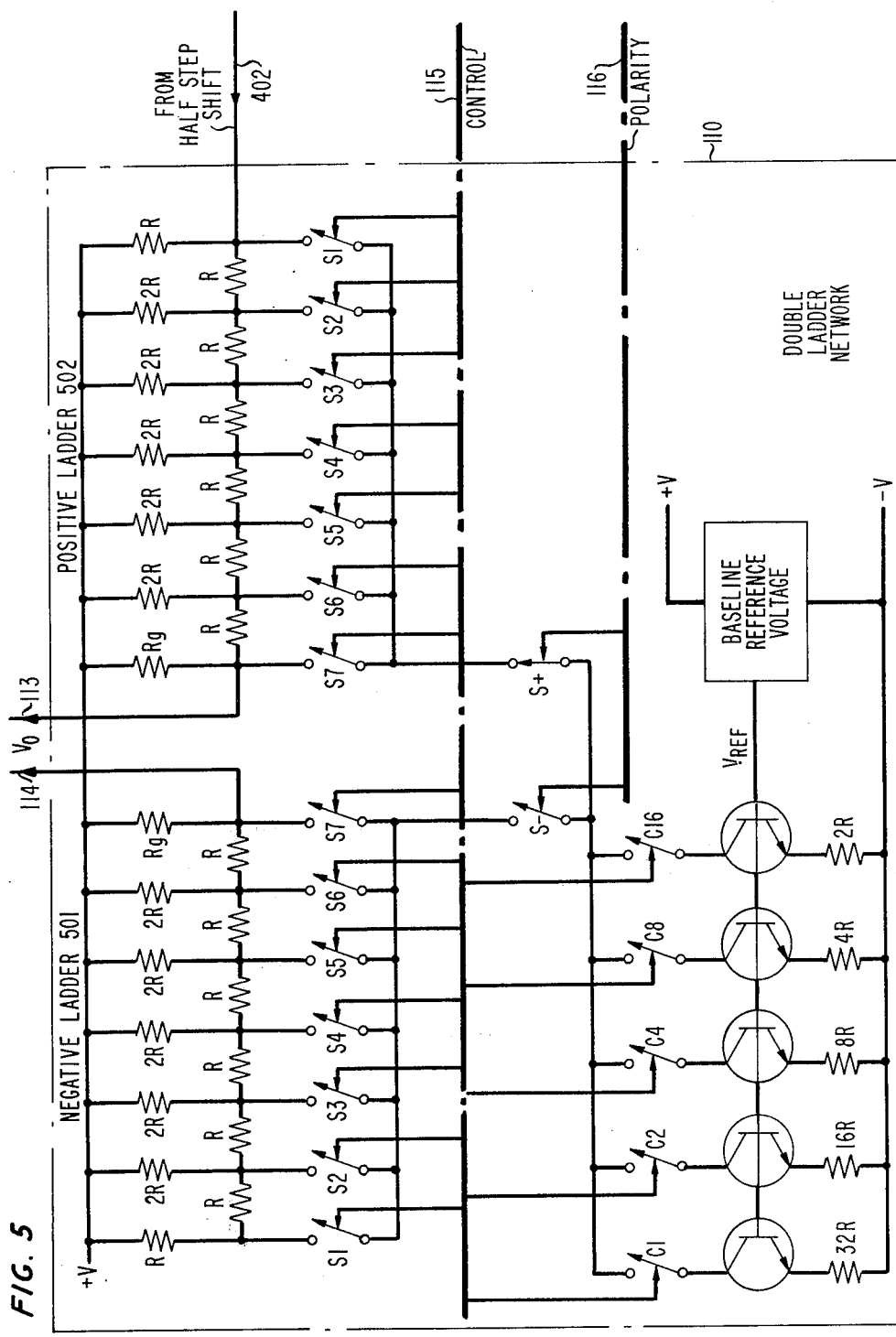
FIG. 5 is a schematic diagram of the double ladder network depicted in FIG. 4.

An illustrative double ladder network which generates reference voltages for the A-law encoding of an analog sample is shown in FIG. 5. Double ladder network 110 comprises two R-2R ladders, designated as negative ladder 501 and positive ladder 502, along with five switchable current sources C1 through C16. Each current source is supplied with the same base line reference voltage $V_{REF}$. The differential voltage, $V_0$, appearing across leads 113 and 114 is generated by operation of ladder switches S1 through S7, polarity switches S+ or S− and switchable current sources C1 through C16. Operation of these switches is under the control of logic unit 403 via control 115 and polarity 116 cables. In this regard, it should be understood that all switches, while shown as mechanical switches in FIG. 5, are actually electrical devices.

In A-law coding, there are a total of 13 segments or 14 cords since the segment at the origin contains two collinear cords. The first segment has 32 equal steps above and below the origin. Each succeeding segment has 16 equal steps and they are twice the level of the steps within the previous segment. In order to achieve the required coding characteristic, the encoding process is broken down into two sequences. First, the chord wherein the level of the analog sample falls is determined. Second, the step within the chord is determined.

Consider the current path through double ladder network 110. Current flowing through the ladder generates a differential voltage, $V_0$, between output leads 113 and 114. Current flows first through the ladder via either the S+ or S− polarity switch and thence through a combination of current sources shown. A current "I" flowing through either switch S1 produces a differential output voltage "V" at the output of the ladder. The same current "I" flowing through either switch S2 produces an output voltage of 2"V". The same current "I" flowing through either switch S3 produces an output voltage of 4"V", etc. Hence, each ladder switch doubles the output voltage produced by the same current flowing through the previous switch. Only one ladder switch can be selected at a time.

Five switchable current sources C1 through C16 are binary weighted and any combination of current sources may be on at one time. Current source C16, however, is only off whenever the encoder output is to be within the lower half of the first segment. Switching C16 only during the first segment provides the encoder with the capability to produce 32 equal steps in the first segment. The encoder produces 16 equal steps for each of the remaining six segments. Therefore, a total of 128 precision voltages can be produced across leads 113 and 114 by operation of each R-2R ladder within double ladder network 110.

Figure 6:
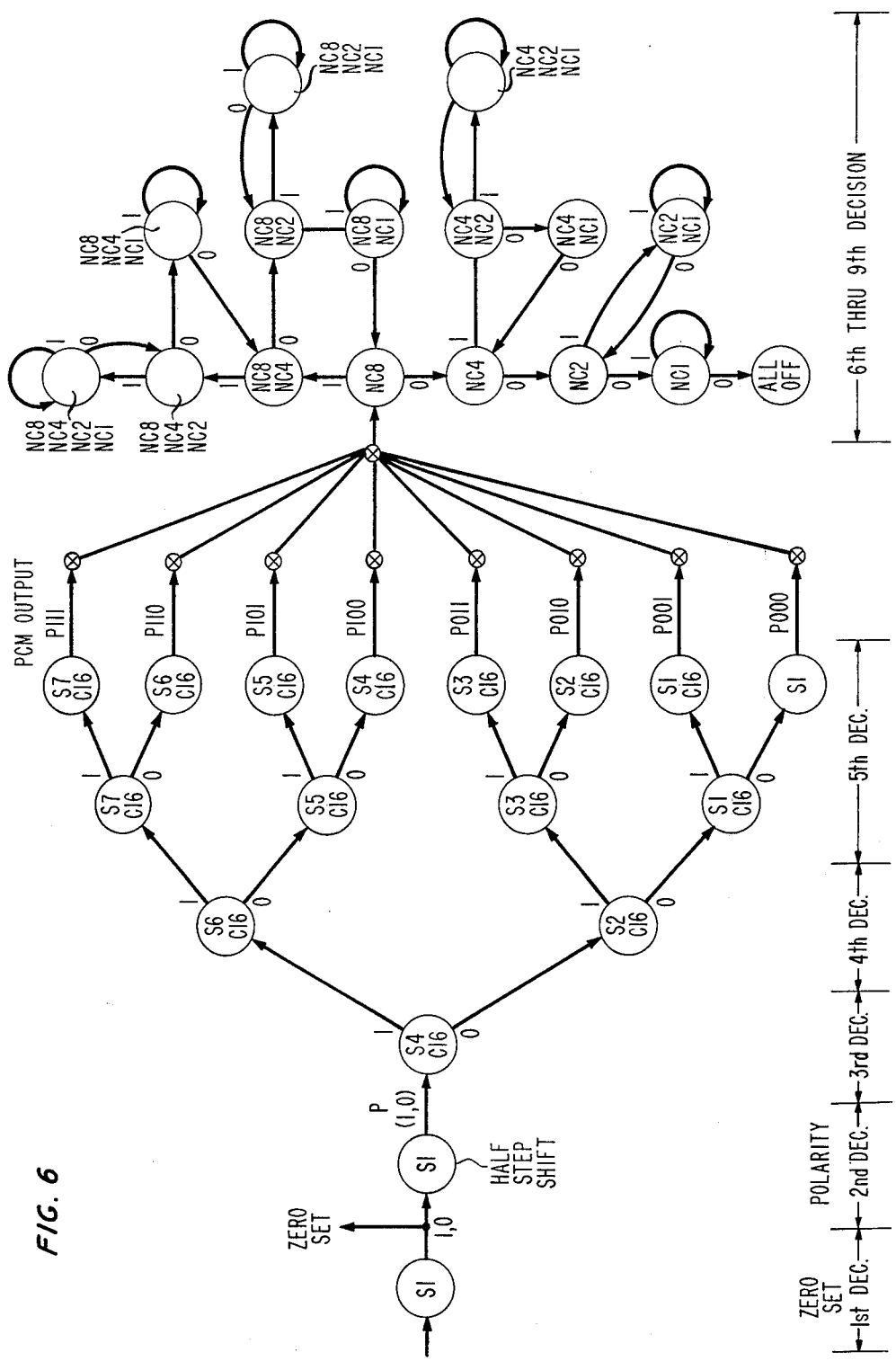
FIG. 6 is the switch state diagram which governs the operation of the double ladder network of FIG. 5.

FIG. 6 shows the switch state diagram used for the sequential generation of the reference voltages. Decisions 2 through 5 determine the chord, while decisions 6 through 9 determine the step within the chord selected. The encoding sequence for determining the first three binary digits is always the same. The sequence begins by closing switch S1 to generate 0 volts across leads 113 and 114. For consistency, this switch is activated in "positive" ladder 502 along with the S+ polarity switch. The comparator output from this first polarity decision is either "0" or "1" and is supplied through logic unit 403 to zero set circuit 401. Next, a second comparator decision is made by activating mid-step-shift biaser 402 along with switch S1. The second comparator output is the polarity bit that is transmitted on output 103 and is designated as "P". If the polarity is "1", succeeding switch operations will continue on "positive" ladder 502. If, however, the polarity bit is "0", then succeeding switches will be operated on negative ladder 501. For the third decision, switch S4 is closed and switchable current source C16 is turned on. The ladder switch operations which now follow are dependent upon the comparator output. If the third comparator output is "1", for example, switch S4 is opened and switch S6 is closed. Alternatively, if the third output is "0", switch S4 is opened and switch S2 is closed. The proper switch sequence may be determined in reference to FIG. 6 by following the appropriate "1" or "0" vector emanating from the circled switch designation. The switch designations within each circle shows the switches that are closed. Once the fifth decision is made, the last switches that were set are held without change for the remainder of the encoding process. Eight possible combinations of four binary digits have now been determined. These combinations are indicated in FIG. 6 following the 5th decision. The chord step closest to the analog signal must now be determined.

The closest chord step is determined by decisions 6 through 9. For decisions 6 through 9, the required reference voltages are produced by activating the switchable current sources C1 through C8 by closing their respective switches. Current source C8 is always selected as the starting point. The subsequent current sources selected are determined by the immediately preceding comparator output. Following the 9th decision, the closest chord step to the analog signal has been determined. This step is represented by a series of four binary digits and is transmitted on output 103 following the digits from decisions 2 through 5.

FIG. 7 shows a block diagram of logic unit 403. Logic unit 403 is identical to logic unit 112 except for the addition of flip-flop F1, set-reset flip-flop 711 and one port on demultiplexer 702. The binary digits generated by comparator 109 are supplied to logic unit 403 on lead 111. Lead 111 is connected to the D-inputs of negative-edge-triggered flip-flops F1 through F8 and an input to AND gate 710. Demultiplexer 702, connected to write clock 701, distributes successive write clock pulses across ports 1 through 9. The clock input CLK of flip-flops F1 through F8 are respectively connected to ports 1 through 8. Port 9 is directly connected to the reset lead R of set-reset flip-flop 711 and switch control unit 715. Upon the negative transition of the clock pulses from ports 1 to 8, the binary digits generated from the first eight comparator decisions are respectively strobed into flip-flops F1 through F8 and appear on the Q outputs. The 9th comparator decision is not stored in a flip-flop but is directly coupled to a first input of AND gate 710.

The Q outputs of flip-flops F2 through F8 are respectively tied to a first input of AND gates 703 through 709. It should be noted that the Q output of flip-flop F1 is not connected to an AND gate and thus does not appear on output 103. Flip-flop F1 stores the first comparator decision during each analog sample encoding and is connected to zero set circuit 401 via lead 404. Read clock 713 lags write clock 701. Demultiplexer 712 is connected to read clock 713 to distribute successive read clock pulses on leads 1 through 8. These clock pulses are sequentially applied to the second input of AND gates 703 through 710 thereby clocking the binary digits from comparator decisions 2 through 9 to OR gate 714. As each binary digit appears as an input to OR gate 714 it is coupled to output 103.

The activation of half step shifter 402 is provided by set-reset flip-flop 711. The set input S and the "1" output of flip-flop 711 are tied to port 1 of demultiplexer 702 and half step shifter 402, respectively. The reset lead R is tied to port 9 of demultiplexer 702. Accordingly, half step shifter 402 is turned on by the occurrence of the write clock pulse on port 2 and turned off after the write clock pulse on port 9.

Switch control 715 receives the Q outputs of flip-flops F3 through F8 to activate the ladder and current source switches within double ladder network 110 according to switch state diagram of FIG. 6. The clock pulses on port 9 of demultiplexer 702 is also connected to switch control 715 to initialize the logic therein after the ninth comparator decision has been made. This initialization closes the S1 ladder and S+ polarity switches and opens all the remaining ladder and current source switches. Control cable 115 couples the signals generated by switch control 715 to double ladder network 110.

Control of polarity switches S+ and S− within double ladder network 110 is provided by inverters 716, 717 and AND gate 718. AND gate 718 is activated in the absence of a clock signal to flip-flop F2. When activated, gate 718 couples the Q output of flip-flop F2, which is the second polarity decision, to the S+ switch. Inverter 717 inverts the output of AND gate 718 and couples the same to the S− polarity switch. A "1" and "0" to the S+ and S− polarity switches maintain them in a closed and opened position, respectively.

It will, of course, be understood that the use of the present invention in a digital transmission system requires no modification to the existing equipment for decoding in the receiver terminal.

We claim:
1. A mid-riser biased, successive approximation encoder (400) for converting an analog signal sample to a multi-bit PCM code word comprising;
comparator means (109) for sequentially comparing said analog signal sample to a series of reference signals and generating an output from each comparison, the first comparison being a polarity decision,
reference signal generation means (110) for producing said series of reference signals,
logic means (715) responsive to said comparator output for controlling the sequential application of said reference signals to said comparator and converting said comparator output to a bit of said PCM code word, said encoder characterized by
feedback means (401) for receiving said polarity decision from said comparator and generating a signal therefrom to reduce any dc component in the analog sample signal to substantially zero, second reference signal generating means (402, 110) for producing a non-zero offset reference signal corresponding to a predetermined intermediate position between two quantizing boundaries, and control means (701, 702, 711, F1) for the application of said offset reference signal to said comparator immediately following said polarity decision to generate a second polarity decision from said comparator output, said offset reference signal being applied with said series of reference signals until said analog signal sample is coded, said control means also inhibiting said logic means from converting said polarity decision to a bit of said PCM code word and substituting instead said second polarity decision.

2. The encoder of claim 1 wherein said non-zero offset reference signal corresponds to the midpoint between two quantizing boundaries.

3. The encoder of claim 2 wherein said non-zero offset reference signal corresponds to the midpoint of the first positive code step immediately adjacent to the origin.

4. The encoder of claim 2 wherein said non-zero offset reference signal corresponds to substantially the midpoint of the first negative code step immediately adjacent to the origin.

5. The encoder of claim 3 wherein said analog signal sample is a pulse amplitude modulated sample.

6. The encoder of claim 4 wherein said analog signal sample is a pulse amplitude modulated sample.

7. The encoder of claims 5 or 6 wherein the conversion of a pulse amplitude modulated signal is pursuant to an A-law coding characteristic.

8. A method of reducing idle channel noise and crosstalk in coding an analog signal sample into a multi-bit PCM code word according to a mid-riser biased coding characteristic having a plurality of code steps disposed between quantizing boundaries comprising the steps of comparing said analog signal sample to a first reference signal and generating a first binary digit in said multi-bit PCM code word which represents the polarity of said analog signal, comparing said analog signal sample to a series of reference signals (110) and generating a series of binary digits in said multi-bit PCM code word which represent the code step which most nearly corresponds to the amplitude of said analog signal sample, said method characterized by the steps of coupling said first binary digit to feedback circuitry (401) to reduce any d.c. component in said analog signal sample to substantially zero, and generating a non-zero offset reference signal (402, 110) corresponding to a predetermined intermediate position on a code step, comparing (711) said analog signal to said non-zero offset reference signal and generating a second binary digit therefrom following said comparison using said first reference signal and before the comparisons using said series of reference signals, applying (711) said non-zero reference signal to said series of reference signals during the generation of said series of binary digits, substituting said second binary digit for said first binary digit in said multi-bit PCM code word.

9. The method of claim 8 wherein said non-zero reference signal corresponds to the midpoint of a code step.

10. The method of claim 9 wherein said non-zero reference signal corresponds to the mid-point of the first positive code step immediately adjacent to the origin.

11. The method of claim 9 wherein said non-zero reference signal corresonds to the mid-point of the first negative code step immediately adjacent to the origin.

12. The method of claim 10 wherein said analog signal sample is a pulse amplitude modulated sample.

13. The method of claim 11 wherein said analog signal sample is a pulse amplitude modulated sample.

14. The method of claims 12 or 13 wherein said mid-riser biased coding characteristic is an A-law characteristic.

* * * * *